(12) United States Patent
Chang et al.

(10) Patent No.: US 11,616,209 B2
(45) Date of Patent: Mar. 28, 2023

(54) FORMATION OF A TWO-LAYER VIA STRUCTURE TO MITIGATE DAMAGE TO A DISPLAY DEVICE

(71) Applicant: Taiwan Semiconductor Manufacturing Company, Ltd., Hsin-Chu (TW)

(72) Inventors: Yung-Chang Chang, Taipei (TW); Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 48 days.

(21) Appl. No.: 17/361,693

(22) Filed: Jun. 29, 2021

(65) Prior Publication Data

US 2021/0328174 A1 Oct. 21, 2021

Related U.S. Application Data

(62) Division of application No. 16/601,712, filed on Oct. 15, 2019, now Pat. No. 11,069,873.

(51) Int. Cl.
*H01L 51/52* (2006.01)
*H01L 27/32* (2006.01)
*H01L 51/56* (2006.01)

(52) U.S. Cl.
CPC ...... *H01L 51/5218* (2013.01); *H01L 27/3211* (2013.01); *H01L 27/3258* (2013.01); *H01L 51/56* (2013.01)

(58) Field of Classification Search
CPC .......................... H01L 51/5218; H01L 27/3258
See application file for complete search history.

(56) References Cited

U.S. PATENT DOCUMENTS 4,538,143 A    8/1985  Ito
2013/0270526 A1  10/2013 Kim et al.

FOREIGN PATENT DOCUMENTS

CN        108364976 A    8/2018

OTHER PUBLICATIONS

Waechtler et al. "Optical Properties of Sputtered Tantalum Nitride Films Determined by Spectroscopic Ellipsometry." hG-IZM Micro Devices 2 and Equipment. The date of publication is unknown. Retrieved online on Aug. 8, 2019 from https://www.researchgate.netpublication/28670110_Optical_Properties_of_Sputtered_Tantalum_Nitride_Films_Determined_by_Spectroscopic_Ellipsometry.

(Continued)

*Primary Examiner* — Anthony Ho
(74) *Attorney, Agent, or Firm* — Eschweiler & Potashnik, LLC

(57) ABSTRACT

In some embodiments, the present disclosure relates to a method that includes forming an isolation structure over a reflector electrode and forming a protective layer over the isolation structure. Further, a first removal process is performed to form a first opening in the protective layer and the isolation structure to expose a first surface of the reflector electrode. A cleaning process is performed to clean the first surface of the reflector electrode. A conductive layer is formed over the protective layer and within the first opening. The conductive layer includes a different material than the protective layer. A second removal process is performed to remove peripheral portions of the protective layer and the conductive layer to form a via structure within the opening, extending through the isolation structure to contact the reflector electrode, and including the protective layer and the conductive layer.

20 Claims, 8 Drawing Sheets

(56) References Cited

OTHER PUBLICATIONS

Southwest Center for Microsystems Education (SCME) University of New Mexico. "The Rainbow Wafer Activity: Etch Overview for Microsystems." Published in 2010.
Physics and Radio Electronics. "Light Emitting Diode (LED)—Working, Construction and Symbol—Diode." The date of publication is unknown. Retrieved online on Aug. 2, 2019 from https://www.physics-and-radio-electronics.com/electronic-devices-and-circuits/semiconductor-diodes/lightemittingdiodeledconstructionworking.html.
Hulman, Martin. "Graphene: Properties, Preparation, Characterisation and Devices—Chapter 7: Light Scattering." Published Feb. 25, 2014.
Mirshafieyan et al. "Silicon colors: spectral selective perfect light absorption in single layer silicon films on aluminum surface and its thermal tunability." Optical Society of America, Dec. 15, 2014, vol. 22, No. 25, published on Dec. 12, 2014.
Wikipedia.org "OLED" Published on Jul. 23, 2019.
Bohlen, Brandon Scott. "PECVD grown DBR for microcavity OLED sensor." Retrospective Theses and Dissertations, Iowa State University, published in 2007.
Wikipedia.org "Pixel" Published on Jul. 27, 2019.
Phuong, Le Minh. "Silicon Light Emitting Devices for Integrated Applications." Ph.D. thesis, University of Twente, published on Jan. 31, 2003.
Addison Engineering. "Silicon Nitride—LPCVD Grown." The date of publication is unknown. Retrieved online on Aug. 8, 2019 from https://irp-cdn.multiscreensite.com/934e04a5/files/uploaded/ColorChart_SiliconNitride.pdf.
Wikipedia.org. "Sputter Cleaning." Published on Nov. 6, 2017.
Wikipedia.org "Sputtering." Published on May 4, 2019.
Wikipedia.org "Transparent conducting film." Published on Jul. 13, 2019.
Notice of Allowance dated Mar. 11, 2021 for U.S. Appl. No. 16/601,712.

FORMATION OF A TWO-LAYER VIA STRUCTURE TO MITIGATE DAMAGE TO A DISPLAY DEVICE

REFERENCE TO RELATED APPLICATION

This Application is a Divisional of U.S. application Ser. No. 16/601,712, filed on Oct. 15, 2019, the contents of which are hereby incorporated by reference in their entirety.

BACKGROUND

Many modern day electronic devices, such as televisions and cellular devices, use image display devices to convert digital data into optical images. To achieve this, the image display device may comprise an array of pixel regions. Each pixel region may have an optical emitter structure and may be coupled to a semiconductor device. The semiconductor device may selectively apply an electrical signal (e.g., a voltage) to the optical emitter structure. Upon application of the electrical signal, the optical emitter structure may emit an optical signal (e.g., light). The optical emitter structure may, for example, be an organic light emitting diode (OLED) or some other suitable light emitting device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
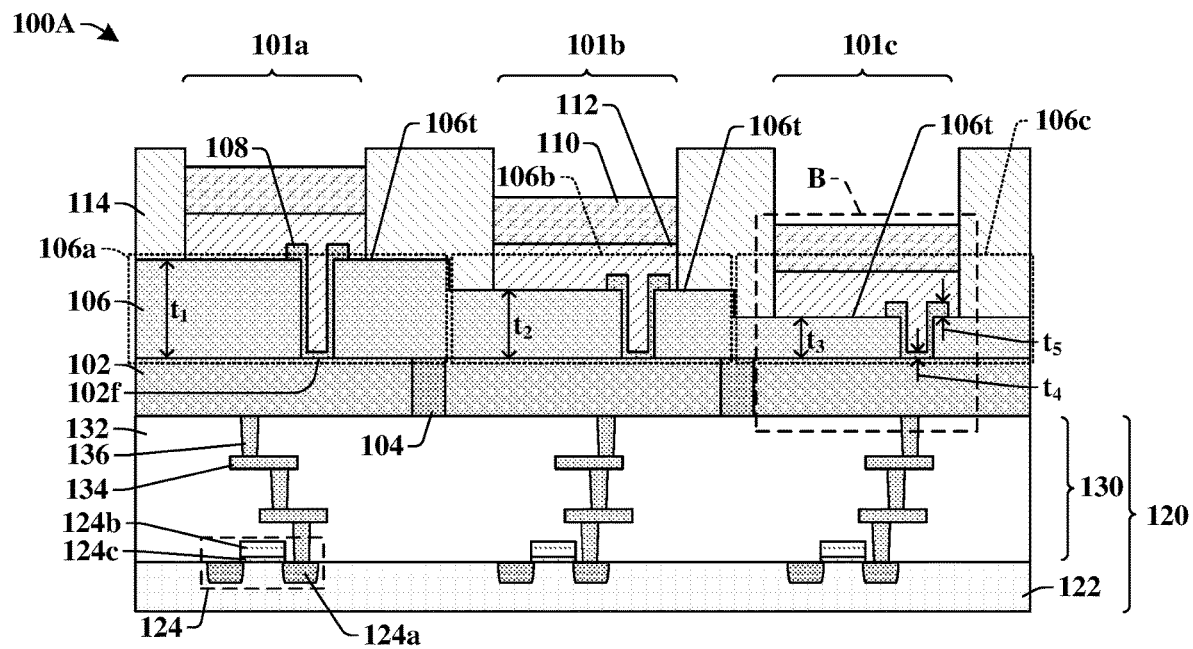
FIGS. 1A and 1B illustrate cross-sectional views of some embodiments of a display device having a via structure extending through an isolation structure, the via structure having an upper horizontal segment that is thicker than a center horizontal segment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A display device includes an array of pixel regions, wherein each pixel region comprises an isolation structure arranged between a reflector electrode and a transparent electrode. A via structure may extend through the thickness of the isolation structure and electrically couple the reflector electrode to the transparent electrode. An optical emitter structure may be arranged over the transparent electrode. The isolation structure may comprise silicon dioxide having a thickness that corresponds to a certain color. For example, during operation of the display device, an electrical signal (e.g., voltage) may be applied to the transparent electrode from circuitry coupled to the reflector electrode, the via structure, and the transparent electrode. The electrical signal may cause light to be produced at the interface between the optical emitter structure and the transparent electrode (e.g., due to electron-hole recombination). The light may reflect off a top surface of the isolation structure and/or may travel through the isolation structure, reflect off of the reflector electrode, and travel back towards the top surface of the isolation structure. Due to constructive and/or destructive interference of a given wavelength of light at the top surface of the isolation structure, colored light according to the thickness of the isolation structure may be emitted from a top surface of the optical emitter structure.

To form the via structure, the isolation structure may, for example, be formed over the reflector electrode, and an opening in the isolation structure is formed to expose a first surface of the reflector electrode. The opening may be formed using an etching process, which leaves behind residue (e.g., a metal oxide) on the first surface of the reflector electrode. Thus, a cleaning process, such as an argon sputtering process, is conducted to remove the residue from the first surface of the reflector electrode. Absent the cleaning process, electrical contact between the via structure and the first surface may be poor (e.g., contact resistance may be high). However, the cleaning process damages (e.g., increases the surface roughness) upper surfaces of the isolation structure. Because the upper surfaces of the isolation structure receive and reflect light, when the upper surfaces of the isolation structure are damaged, the light may scatter, which may cause the emitted light to be a different color and/or reduce the intensity of the emitted light, for example. Thus, the cleaning process may result in an unreliable display device.

Various embodiments of the present disclosure are directed towards a method of forming a via structure comprising a protective layer and a conductive layer on an isolation structure to prevent damage to the isolation structure of a display device. In some embodiments, a protective layer is deposited over an isolation structure on a reflector electrode, such that the protective layer directly contacts top surfaces of the isolation structure. A first etching process may be performed to form a first opening in the protective layer and the isolation structure to expose a first surface of the reflector electrode. A cleaning process may be performed to remove any residue on the first surface of the reflector electrode. Then, a conductive layer is deposited over the protective layer, on sidewalls of the first opening defined by inner sidewalls of the isolation structure, and on the first surface of the reflector electrode. A second etching process may be performed to remove peripheral portions of the protective layer and the conductive layer to form a via structure. The via structure comprises a center segment directly contacting the reflector electrode, a sidewall segment connected to the center segment and extending upwards towards the top surfaces of the isolation structure, and an upper horizontal segment connected to the sidewall segment and directly contacting the top surfaces of the isolation structure. The horizontal segment comprises the protective layer and the conductive layer, and thus, the horizontal segment may be thicker than the center segment. Because of the deposition of the protective layer on the isolation structure, the top surfaces of the isolation structure are protected during the cleaning process, damage to the top surfaces of the isolation structure is mitigated, and a reliable display device may be produced.

FIG. 1A illustrates a cross-sectional view 100A of some embodiments of a display device comprising via structures extending through an isolation structure.

The display device of the cross-sectional view 100A includes a first pixel region 101a, a second pixel region 101b, and a third pixel region 101c. Each of the first, second, and third pixel regions 101a, 101b, 101c are configured to emit a different color of light (e.g., red, green, blue) when subjected to an electrical signal (e.g., voltage), and the color of light depends on the thickness of the isolation structure 106. For example, in some embodiments, the first pixel region 101a may comprise a first portion 106a of the isolation structure 106 that has a first thickness $t_1$; the second pixel region 101b may comprise a second portion 106b of the isolation structure 106 that has a second thickness $t_2$; and the third pixel region 101c may comprise a third portion 106c of the isolation structure 106 that has a third thickness $t_3$. In some embodiments, the first, second, and third thicknesses $t_1$, $t_2$, $t_3$ are each different from one another. For example, in some embodiments, the first thickness $t_1$ may be greater than the second and third thicknesses $t_2$, $t_3$, and the second thickness $t_2$ may be greater than the third thickness $t_3$. In some embodiments, the isolation structure 106 may comprise an oxide (e.g., silicon dioxide), a nitride (e.g., silicon nitride), or some other material that has optical properties, such that incident light may reflect as a colored light due to constructive and/or destructive interference, and wherein the color of the colored light is dependent on the thickness of the isolation structure 106. For example, the first thickness $t_1$ may correspond to green light; the second thickness $t_2$ may correspond to blue light; and the third thickness $t_3$ may correspond to red light.

In some embodiments, the isolation structure 106 is arranged between a reflector electrode 102 and a transparent electrode 112. First barrier structures 104 may be arranged between portions of the reflector electrode 102 such that each pixel region 101a, 101b, 101c comprises an electrically isolated portion of the reflector electrode 102. In some embodiments, an optical emitter structure 110 may be arranged over the transparent electrode 112. Further, in some embodiments, second barrier structures 114 may be arranged over the isolation structure 106 and between portions of the optical emitter structure 110 and the transparent electrode 112 to isolate the first, second, and third pixel regions 101a, 101b, 101c from one another.

In some embodiments, the reflector electrode 102 may be coupled to control circuitry 120. For example, in some embodiments, the reflector electrode 102 is disposed over an interconnect structure 130 comprising a network of interconnect wires 134 and interconnect vias 136 embedded in an interconnect dielectric structure 132. In some embodiments, the interconnect structure 130 is arranged over a substrate 122 and coupled to semiconductor devices 124. In some embodiments, the semiconductor devices 124 may be, for example, metal oxide semiconductor field-effect transistors (MOSFETs) comprising source/drain regions 124a within the substrate 122 and a gate electrode 124b over the substrate 122. The gate electrode 124b may be separated from the substrate 122 by a gate dielectric layer 124c. The control circuitry 120 is configured to selectively supply an electrical signal (e.g., voltage) to each of the first, second, and third pixel regions 101a, 101b, 101c to emit colored light as indicated by digital data.

In some embodiments, each of the first, second, and third pixel regions 101a, 101b, 101c comprises a via structure 108 such that the electrical signal (e.g., voltage) may be supplied to the transparent electrode 112 and the optical emitter structure 110. The electrical signal (e.g., voltage) may, for example, cause electron-hole recombination between the transparent electrode 112 and the optical emitter structure 110 that produces light, and that light may reflect off of top surfaces of the isolation structure 106 and/or travel through the isolation structure 106, reflect off of the reflector electrode 102 and exit through the top surfaces of the isolation structure 106. Due to constructive and/or destructive interference, colored light dependent on the thickness of the isolation structure 106 is emitted.

In some embodiments, the via structure 108 extends from a top surface 106t of the isolation structure 106 and extends down towards a first surface 102f of the reflector electrode 102, thereby electrically coupling the reflector electrode 102 to the transparent electrode 112. The first surface 102f of the reflector electrode 102 may be a top surface of the reflector electrode 102. In some embodiments, the via structure 108 has a fourth thickness $t_4$ along the first surface 102f of the reflector electrode, and the via structure 108 has a fifth thickness $t_5$ along the top surface 106t of the isolation structure 106. In some embodiments, the fifth thickness $t_5$ is greater than the fourth thickness $t_4$ because the via structure 108 may include multiple layers (see, FIG. 1B) along the top surface 106t of the isolation structure 106 as a result of protecting the top surface 106t of the isolation structure 106 during manufacturing of the via structure 108 to produce a reliable display device.

Figure 1B:
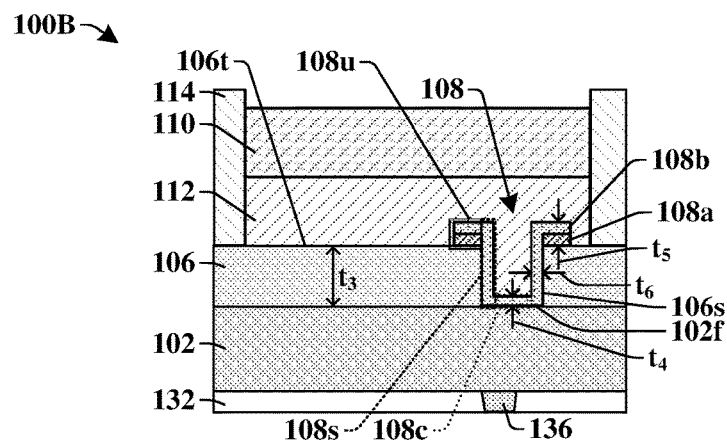

FIG. 1B illustrates a cross-sectional view 100B of some embodiments corresponding to box B of FIG. 1A.

In some embodiments, the via structure 108 may be described as comprising a center horizontal segment 108c contacting the first surface 102f of the reflector electrode 102, a sidewall vertical segment 108s contacting an inner sidewall 106s of the isolation structure 106, and an upper horizontal segment 108u contacting the top surface 106t of the isolation structure 106, wherein the sidewall vertical segment 108s connects the upper horizontal segment 108u to the center horizontal segment 108c. In some embodiments, from the cross-sectional view 100B, there are two upper horizontal segments 108u separated from one another by the transparent electrode 112, and there are two sidewall vertical segments 108s separated from one another by the transparent electrode 112. In some embodiments, the upper horizontal segment 108u comprises a conductive layer 108b over a protective layer 108a, and the sidewall vertical segment 108s and the center horizontal segment 108c comprise the conductive layer 108b and not the protective layer 108a.

In some embodiments, the protective layer 108a and the conductive layer 108b may each comprise a conductive material. In alternative embodiments, the protective layer 108a is a dielectric material different than the isolation structure 106 instead of a conductive metal. However, this may degrade electrical coupling to the transparent electrode 112 at sidewalls of the via structure 108. In some embodiments, the protective layer 108a and the conductive layer 108b comprise a same conductive material, whereas in other embodiments, the protective layer 108a and the conductive layer 108b may comprise different conductive materials. For example, in some embodiments, the protective layer 108a and the conductive layer 108b may comprise a same material, such as titanium nitride. Thus, in some embodiments, the protective layer 108a and the conductive layer 108b may not be distinguishable from one another. However, the presence of the protective layer 108a may be detected because the upper horizontal segment 108u has a fifth thickness $t_5$ that is greater than a fourth thickness $t_4$ of the center horizontal segment 108c. In some embodiments, the fourth thickness $t_4$ may be described as a measurement from a bottommost surface of the via structure 108 to a bottommost surface of the transparent electrode 112.

Similarly, in some embodiments, the fifth thickness $t_5$ may be described as a measurement from the top surface 106t of the isolation structure 106 to a topmost surface of the via structure 108. In some embodiments, the fourth thickness $t_4$ is measured in a first direction normal to the first surface 102f of the reflector electrode 102, and the fifth thickness $t_5$ is also measured in the first direction. A difference between the fifth thickness $t_5$ and the fourth thickness $t_4$ may be equal to a thickness of the protective layer 108a. Further, the sidewall vertical segment 108s may have a sixth thickness $t_6$ measured in a second direction that is perpendicular to the first direction. In some embodiments, the sixth thickness $t_6$ may be described as a measurement between an inner sidewall 106s of the isolation structure 106 and an inner sidewall of the transparent electrode 112. In some embodiments, the fifth thickness $t_5$ is greater than each of the fourth thickness $t_4$ and the sixth thickness $t_6$. Further, in some embodiments, the fourth thickness $t_4$ is about equal to the sixth thickness $t_6$.

In some embodiments, the fourth thickness $t_4$ and the sixth thickness $t_6$ may each be in a range of between, for example, approximately 200 angstroms and approximately 700 angstroms. In some embodiments, the fifth thickness $t_5$ may be in a range of between, for example, 300 angstroms and approximately 1000 angstroms. Thus, in some embodiments, a difference between the fourth and fifth thicknesses $t_4$, $t_5$ may be at least equal to 100 angstroms. Further, in some embodiments, a ratio of the fifth thickness $t_5$ to the fourth thickness $t_4$ may be at least equal to approximately 1.15.

Figure 2:
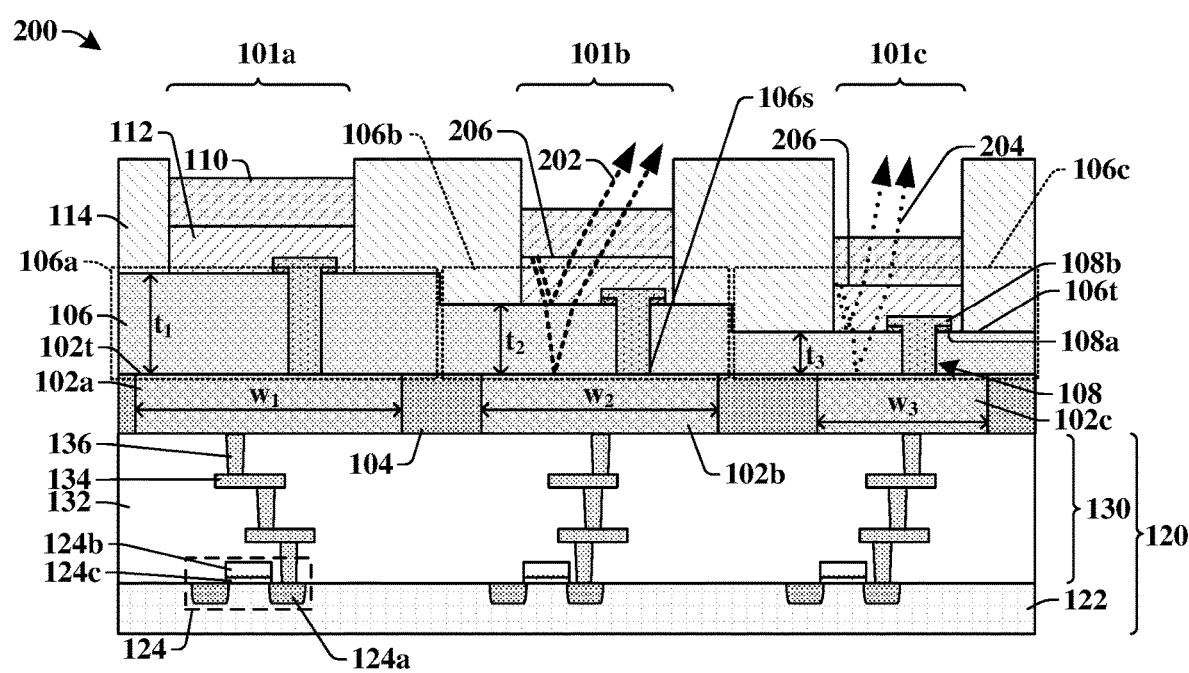
FIG. 2 illustrates a cross-sectional view of some additional embodiments of a display device having a via structure comprising two layers and extending through an isolation structure, as well as example light paths through different thicknesses of the isolation structure.

FIG. 2 illustrates a cross-sectional view 200 of some embodiments of a display device comprising via structure extending through an isolation structure and various light paths during operation of the display device.

In some embodiments, the via structure 108 may completely and continuously fill the space laterally between the inner sidewalls 106s of the isolation structure 106 in each pixel region (101a, 101b, 101c). In such embodiments, the via structure 108 may still comprise the protective layer 108a and the conductive layer 108b. Further, in some embodiments, the conductive layer 108b may extend from above the top surfaces 106t of the isolation structure 106 and to a top surface 102t of the reflector electrode 102, whereas the protective layer 108a may directly contact and be arranged on the top surfaces 106t of the isolation structure 106. The protective layer 108a does not extend below the top surfaces 106t of the isolation structure 106.

In some embodiments, the first pixel region 101a, the second pixel region 101b, and the third pixel region 101c each comprise a reflector electrode (102 of FIG. 1A) having substantially equal widths. However, in other embodiments, as in the cross-sectional view 200 of FIG. 2, the first pixel region 101a may have a first reflector electrode portion 102a having a first width $w_1$; the second pixel region 101b may have a second reflector electrode portion 102b having a second width $w_2$; and the third pixel region 101c may have a third reflector electrode portion 102c having a third width $w_3$. In such embodiments, the first, second, and third widths $w_1$, $w_2$, $w_3$ may be different from one another. For example, in some embodiments, the third width $w_3$ may be smaller than the second width $w_2$, and the second width $w_2$ may be smaller than the first width $w_1$. In some embodiments, the smallest width (e.g., $w_3$) corresponds to the pixel region (e.g., 101c) that has a portion of an isolation structure 106 with a smallest thickness (e.g., $t_3$). Similarly, in some embodiments, the largest width (e.g., $w_1$) corresponds to the pixel region (e.g., 101a) that has a portion of an isolation structure 106 with a smallest thickness (e.g., $t_1$). However, in other embodiments, the relationship between widths of the reflector electrode 102 does not have a correlation with the thicknesses of the isolation structure 106.

The cross-sectional view 200 illustrates an exemplary first light path 202 in the second pixel region 101b and an exemplary second light path 204 in the third pixel region 101c. In some embodiments, light is generated at a first interface 206 between the optical emitter structure 110 and the transparent electrode 112 due to an electrical signal (e.g., voltage) applied to the reflector electrode 102 by the control circuitry 120. For example, in the cross-sectional view 200, the second pixel region 101b and the third pixel region 101c are "ON" (e.g., light is generated at the first interface 206), whereas the first pixel region 101a is "OFF" (e.g., light is not generated at the first interface 206). In the second pixel region 101b, the exemplary first light path 202 shows how in some embodiments, the generated light at the first interface 206 may reflect off of the top surface 106t of the second portion 106b of the isolation structure 106 and/or travel through the second portion 106b of the isolation structure 106, reflect off of the second reflector electrode portion 102b, and travel back up towards the top surface 106t of the second portion 106b of the isolation structure 106. Due to constructive and/or destructive interference, only a colored light having a first wavelength that is associated with the second thickness $t_2$ of the second portion 106b of the isolation structure 106 will be emitted/visible from a top surface of the optical emitter structure 110 in the second pixel region 101b.

Similarly, in the third pixel region 101c, the exemplary second light path 204 shows how in some embodiments, the generated light at the first interface 206 may reflect off of the top surface 106t of the third portion 106c of the isolation structure 106 and/or travel through the third portion 106c of the isolation structure 106, reflect off of the third reflector electrode portion 102c, and travel back up towards the top surface 106t of the third portion 106c of the isolation structure 106. Due to constructive and/or destructive interference, only a colored light having a second wavelength that is associated with the third thickness $t_3$ of the third portion 106c of the isolation structure 106 will be emitted/visible from a top surface of the optical emitter structure 110 in the third pixel region 101c. In some embodiments, because the third thickness $t_3$ of the third portion 106c of the isolation structure 106 being different than the second thickness $t_2$ of the second portion 106b of the isolation structure 106, the second wavelength will be different from the first wavelength, and thus, the third pixel region 101c emits a different colored light than the second pixel region 101b. Thus, the control circuitry 120 may use digital data to selectively turn "ON" one or more of the pixel regions (e.g., 101a, 101b, 101c) to produce an optical image.

FIGS. 3-13 illustrate cross-sectional views 300-1300 of some embodiments of a method of forming a via structure over an isolation structure for a display device, the via structure having a protective layer to prevent damage to the isolation structure. Although FIGS. 3-13 are described in relation to a method, it will be appreciated that the structures disclosed in FIGS. 3-13 are not limited to such a method, but instead may stand alone as structures independent of the method.

Figure 3:
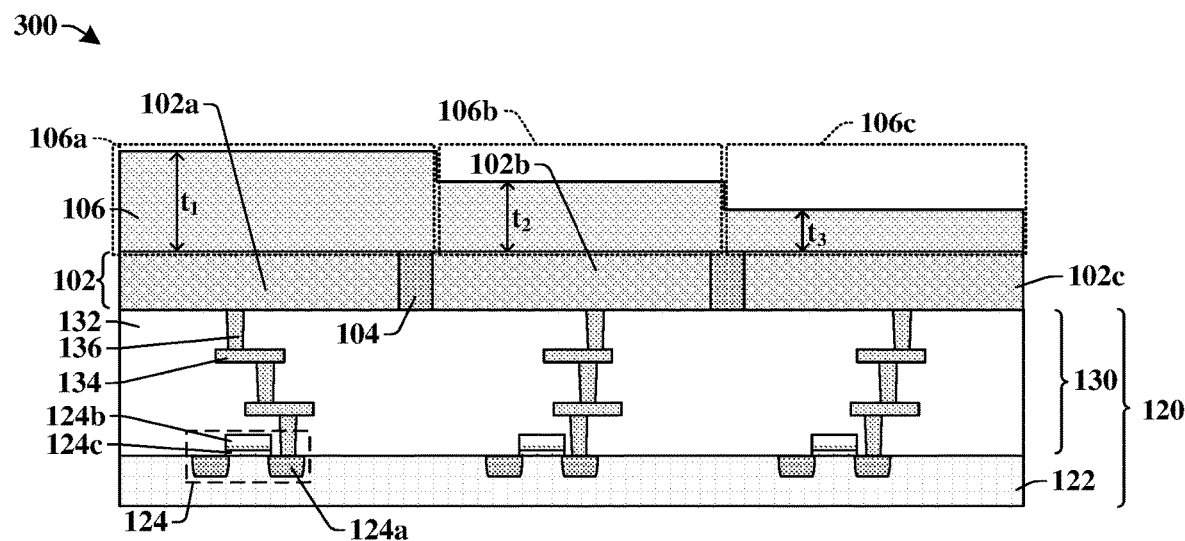
FIGS. 3-12 illustrate cross-sectional views of some embodiments of a method of forming a display device having a via structure that extends through an isolation structure, wherein the via structure comprises a protective layer and a conductive layer to prevent damage to the isolation structure.

As shown in the cross-sectional view 300 of FIG. 3, a reflector electrode 102 may be formed over control circuitry 120. In some embodiments, the control circuitry 120 may comprise an interconnect structure 130 arranged over a substrate 122. The interconnect structure 130 may comprise interconnect wires 134 and interconnect vias 136 embedded in an interconnect dielectric structure 132. In some embodiments, the interconnect wires and vias 134, 136 may comprise copper, tungsten, or the like. The interconnect structure 130 may couple the reflector electrode 102 to semiconductor devices 124 integrated on the substrate 122. In some embodiments, the semiconductor devices 124 may be or comprise metal oxide semiconductor field-effect transistors (MOSFETs), wherein the MOSFETs comprise source/drain regions 124a in the substrate 122. The semiconductor devices 124 may further comprise a gate electrode 124b arranged over a gate dielectric layer 124c on the substrate 122. In alternative embodiments, the reflector electrode 102 may be formed over a carrier substrate, and then the reflector electrode 102 is later removed from the carrier substrate and bonded to control circuitry (120 of FIG. 1A) after the formation of pixel regions (e.g., 101a, 101b, 101c of FIG. 1A).

In some embodiments, the reflector electrode 102 may be separated by first barrier structures 104 such that the reflector electrode 102 has a first reflector electrode portion 102a, a second reflector electrode portion 102b, and a third reflector electrode portion 102c, for example. In some embodiments, the first barrier structures 104 comprise the same material as the interconnect dielectric structure 132. The reflector electrode 102 may comprise a metal that is both electrically conductive and optically reflective. For example, in some embodiments, the reflector electrode 102 may comprise aluminum or aluminum copper. In some embodiments, the first barrier structures 104 may be formed using a deposition process (e.g., physical vapor deposition (PVD), chemical vapor deposition (CVD), PE-CVD, atomic layer deposition (ALD), sputtering, etc.) followed by a patterning process (e.g., photolithography and etching). The reflector electrode 102 may then be formed over the interconnect dielectric structure 132 using a deposition process (e.g., physical vapor deposition (PVD), chemical vapor deposition (CVD), PE-CVD, atomic layer deposition (ALD), sputter-ing, etc.) followed by a patterning process (e.g., photolithography, etching, chemical mechanical planarization (CMP), etc.).

Further, an isolation structure 106 is formed over the reflector electrode 102. In some embodiments, the isolation structure 106 comprises a first portion 106a, a second portion 106b, and a third portion 106c having a first thickness $t_1$, a second thickness $t_2$, and a third thickness $t_3$, respectively. The thicknesses ($t_1$, $t_2$, $t_3$) may be determined based the material of the isolation structure 106 and a predetermined light color to be emitted from each portion (106a, 106b, 106c) of the isolation structure 106. In some embodiments, the isolation structure 106 comprises a material that has optical properties, such that incident light may reflect as a colored light due to constructive and/or destructive interference, and wherein the color of the colored light is dependent on the thickness of the isolation structure 106. Non-limiting examples of such a material include silicon nitride and silicon dioxide. Further, each portion (106a, 106b, 106c) of the isolation structure 106 may be continuously connected to one another. In some embodiments, the formation of the isolation structure 106 may comprise steps of deposition processes (e.g., physical vapor deposition (PVD), chemical vapor deposition (CVD), PE-CVD, atomic layer deposition (ALD), sputtering, etc.) and patterning processes (e.g., photolithography/etching processes). In some embodiments, the first barrier structures 104 comprise the same material as the isolation structure 106. Further in some embodiments, the first barrier structures 104, the interconnect dielectric structure 132, and the isolation structure 106 comprise a same material. In other embodiments, the first barrier structures 104 and/or the interconnect dielectric structure 132 may comprise a dielectric material such as undoped silicate glass (USG), silicon nitride, or like. In some embodiments, the first, second, and third thicknesses $t_1$, $t_2$, $t_3$ of the isolation structure 106 may each be in a range of between, for example, approximately 200 angstroms and approximately 1500 angstroms.

Figure 4:
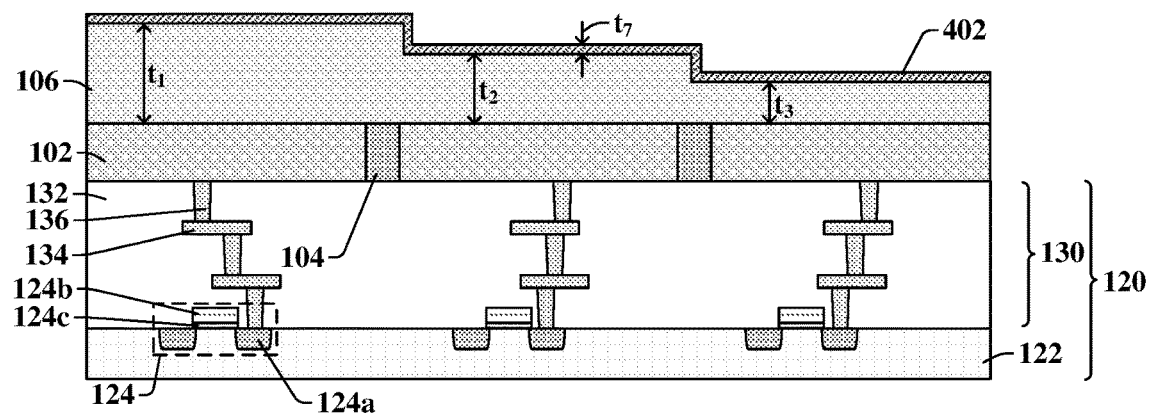

As shown in the cross-sectional view 400 of FIG. 4, in some embodiments, a conformal protective layer 402 is deposited over the isolation structure 106. In some embodiments, the conformal protective layer 402 has a seventh thickness $t_7$ in a range of between, for example, approximately 100 angstroms and approximately 300 angstroms. The conformal protective layer 402 may be deposited by a deposition process (e.g., physical vapor deposition (PVD), chemical vapor deposition (CVD), PE-CVD, atomic layer deposition (ALD), sputtering, etc.). In some embodiments, the conformal protective layer 402 may comprise a conductive metal, such as, for example, titanium nitride or tantalum nitride. In alternative embodiments, the conformal protective layer 402 may instead be a conformal dielectric layer. The conformal protective layer 402 comprises a material resist or to a cleaning process (see, 702 of FIG. 7) later used. Similarly, the seventh thickness $t_7$ of the conformal protective layer 402 is thick enough to prevent the cleaning process (see, 702 of FIG. 7) from causing the top surfaces 106t of the isolation structure 106 to become exposed during the cleaning process (see, 702 of FIG. 7) later used.

Figure 5:
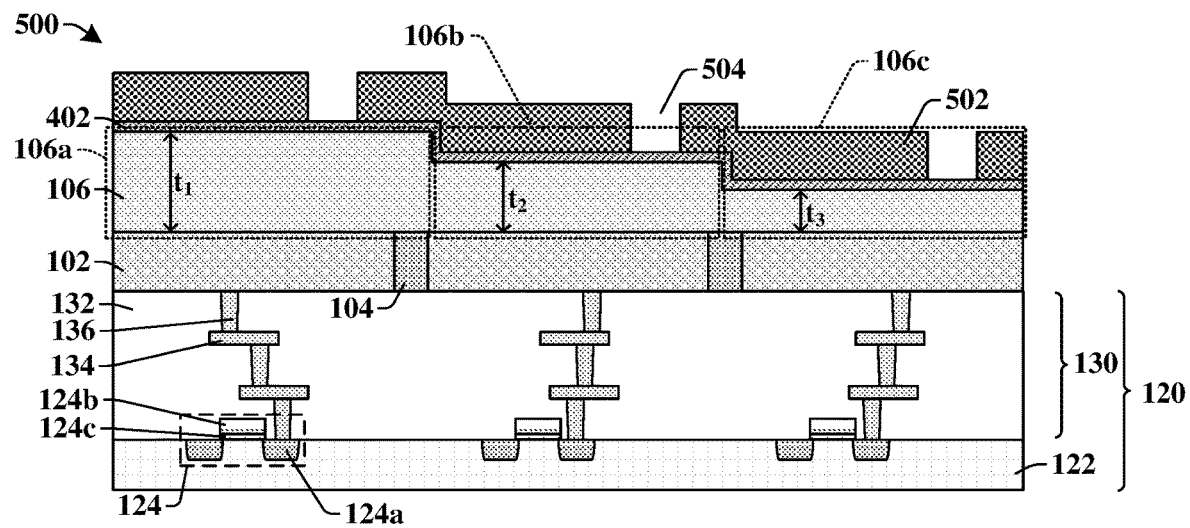

As shown in the cross-sectional view 500 of FIG. 5, in some embodiments, a first masking layer 502 may be formed over the conformal protective layer 402. The first masking layer 502 may comprise first openings 504. In some embodiments, each of the first openings 504 may be arranged over each portion (106a, 106b, 106c) of the isolation structure 106. In some embodiments, the first masking layer 502 may be formed by photolithography and may comprise a photosensitive material (e.g., photoresist) formed by a spin coating process. In such embodiments, the layer of photosensitive material is selectively exposed to electromagnetic radiation according to a photomask or photoreticle. The electromagnetic radiation modifies a solubility of exposed regions within the photosensitive material to define soluble regions. The photosensitive material is subsequently developed to define the first openings 504 within the photosensitive material by removing the soluble regions. In other embodiments, the first masking layer 502 may comprise a hard mask layer (e.g., a silicon nitride layer, a silicon carbide layer, or the like) patterned by, for example, a photolithography/etching process or some other suitable patterning process.

Figure 6:
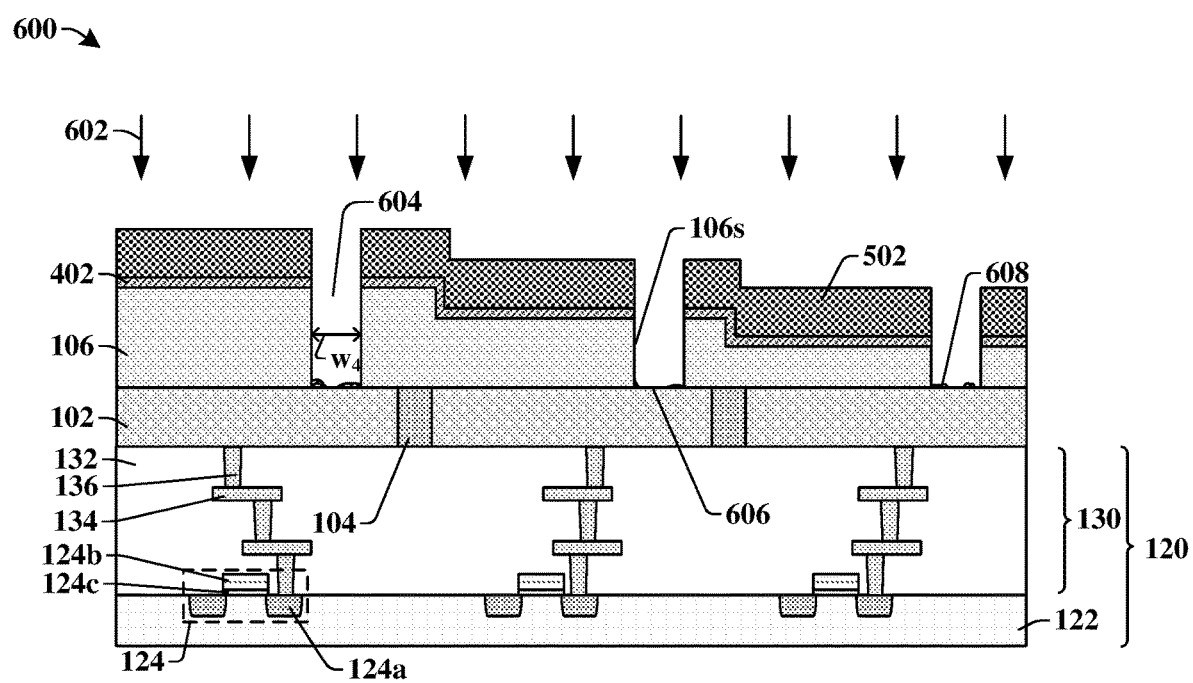

As shown in the cross-sectional view 600 of FIG. 6, a first etching process 602 may be performed to remove portions of the conformal protective layer 402 and the isolation structure 106 underlying the first openings (504 of FIG. 5) of the first masking layer 502, thereby forming second openings 604 in the isolation structure 106. In some embodiments, the second openings 604 have a fourth width $w_4$ in a range of between, for example, approximately 0.1 micrometers and approximately 0.6 micrometers. Bottoms of the second openings 604 may be defined by first surfaces 606 of the reflector electrode 102, and sidewalls of the second openings 604 may be defined by inner sidewalls 106s of the isolation structure 106. In some embodiments, the first etching process 602 is a dry etching process, and residue 608 is left behind on the first surfaces 606 of the reflector electrode 102. The residue may comprise, for example, a metal oxide, comprising material of the isolation structure 106, the reflector electrode 102, and/or the conformal protective layer 402.

Figure 7:
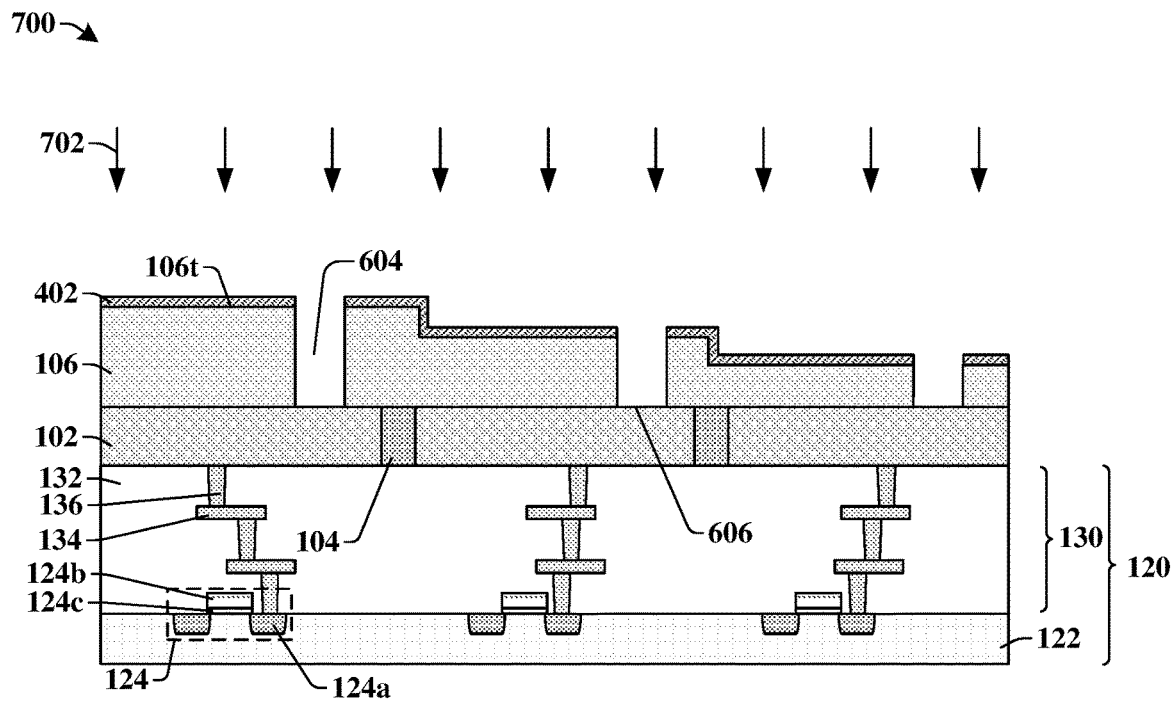

As shown in the cross-sectional view 700 of FIG. 7, the first masking layer (502 of FIG. 6) may be removed, and a cleaning process 702 may be performed over the isolation structure 106 to remove the residue (608 of FIG. 6) on the first surfaces 606 of the reflector electrode 102. In some embodiments, the cleaning process 702 may be or comprise an argon sputtering process. Further, in such embodiments, during the cleaning process 702, top surfaces 106t of the isolation structure 106 are covered by the conformal protective layer 402. Thus, the top surfaces 106t of the isolation structure 106 are protected by the conformal protective layer 402 and damage to the isolation structure 106 by the cleaning process 702 is prevented. Because the top surfaces 106t are used for the reflection of light (see, FIG. 2) during the operation of the display device, the prevention of damage (e.g., an increase in surface roughness, change in composition, etc.) to the top surfaces 106t of the isolation structure is important for a reliable display device. Thus, before the cleaning process 702 (e.g., FIG. 6), the isolation structure 106 may have top surfaces 106t having a first average surface roughness, and after the cleaning process 702, the top surfaces 106t may have a second average surface roughness that is the same as the first average surface roughness because of the conformal protective layer 402. In some embodiments, to measure average surface roughness, a roughness measurement tool (e.g., a profilometer, AFM) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the surface roughness is quantified by measuring a total thickness variation (TTV). The TTV of a layer is the difference between the smallest thickness and the largest thickness of the layer. The TTV is measured throughout the length of a layer.

Figure 8:
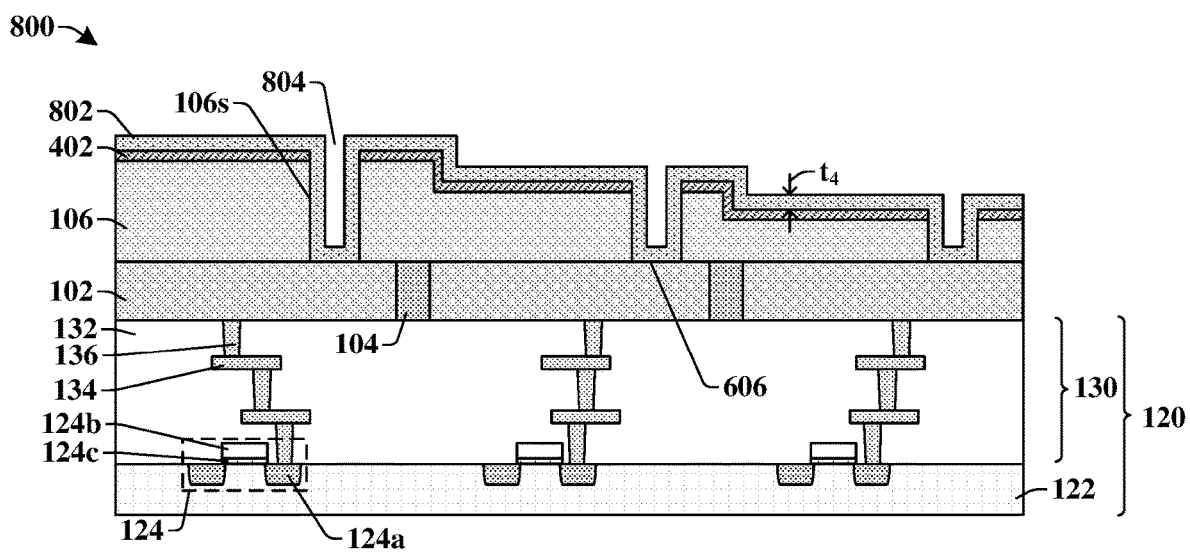

As shown in the cross-sectional view 800 of FIG. 8, a conformal conductive layer 802 may be deposited over the conformal protective layer 402 and along the sidewalls and bottoms of the second openings (604 of FIG. 7). In some embodiments, the conformal conductive layer 802 has a fourth thickness $t_4$ in a range of between, for example, approximately 200 angstroms and approximately 700 angstroms. In other embodiments, the fourth thickness $t_4$ may be in a range of between, for example, approximately 100 angstroms and approximately 900 angstroms. In some embodiments, the fourth thickness $t_4$ is greater than the seventh thickness $t_7$ of the conformal protective layer 402, whereas in other embodiments, the fourth thickness $t_4$ may be less than or about equal to the seventh thickness $t_7$. Further, the conformal conductive layer 802 may not fill in the second openings (604 of FIG. 7), and thus, third openings 804 may remain between the inner sidewalls 106s of the isolation structure 106. In other words, two times the fourth thickness $t_4$ is less than the fourth width ($w_4$ of FIG. 6) of the second openings (604 of FIG. 7). In alternative embodiments, the conformal conductive layer 802 may completely fill the second openings (604 of FIG. 7), such that the third openings 804 are not present. (see, 108 of FIG. 2). Thus, in alternative embodiments, the fourth thickness $t_4$ may be greater than half of the fourth width ($w_4$ of FIG. 6) of the second openings (604 of FIG. 7). In such alternative embodiments, the conformal conductive layer 802 may have upper surfaces with small indents that overlie the first surface 606 of the reflector electrode 102.

Further, in some embodiments, the conformal conductive layer 802 may comprise a conductive metal, such as, for example, titanium nitride or tantalum nitride. Thus, in some embodiments, the conformal protective layer 402 and the conformal conductive layers 802 comprise a same material. In other embodiments, the conformal conductive layer 802 may comprise a different material than the conformal protective layer 402. The conformal conductive layer 802 may directly contact the first surface 606 of the reflector electrode 102 because of the removal of residue (608 of FIG. 8) by the cleaning process (702 of FIG. 7). The direct contact between the conformal conductive layer 802 and the reflector electrode 102 allows for a reliable electrical connection. The conformal conductive layer 802 may be deposited by a deposition process (e.g., physical vapor deposition (PVD), chemical vapor deposition (CVD), PE-CVD, atomic layer deposition (ALD), sputtering, etc.).

Figure 9:
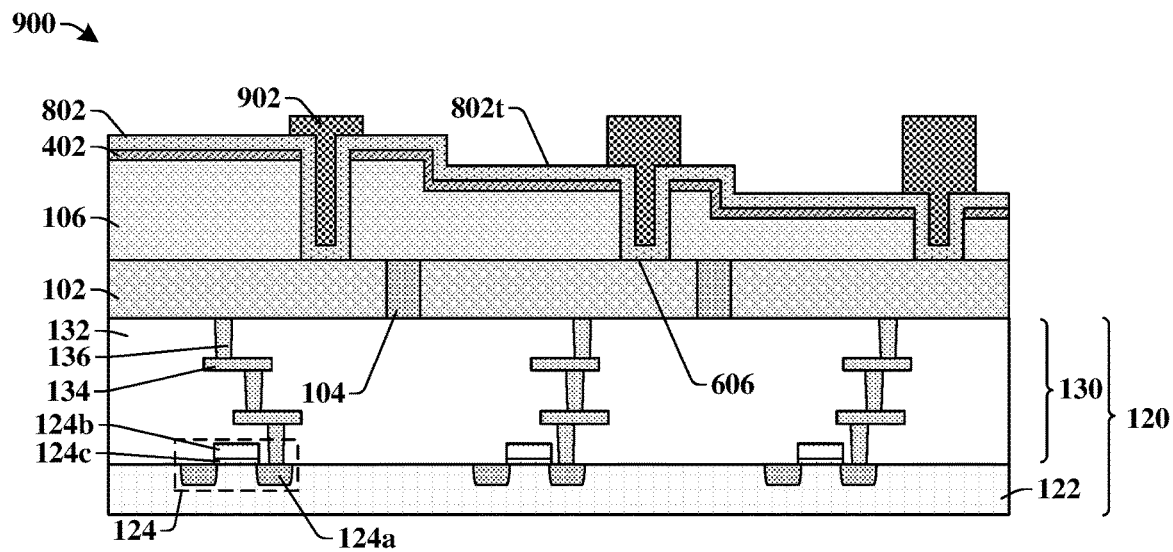

As shown in the cross-sectional view 900 of FIG. 9, a second masking layer 902 is formed over the conformal conductive layer 802 and within the third openings (804 of FIG. 8). The second masking layer 902 may overlie portions of top surfaces 802t of the conformal conductive layer 802. It will be appreciated that second masking layer may be formed by a similar photolithography process as used for the first masking layer 502 in FIG. 5.

Figure 10:
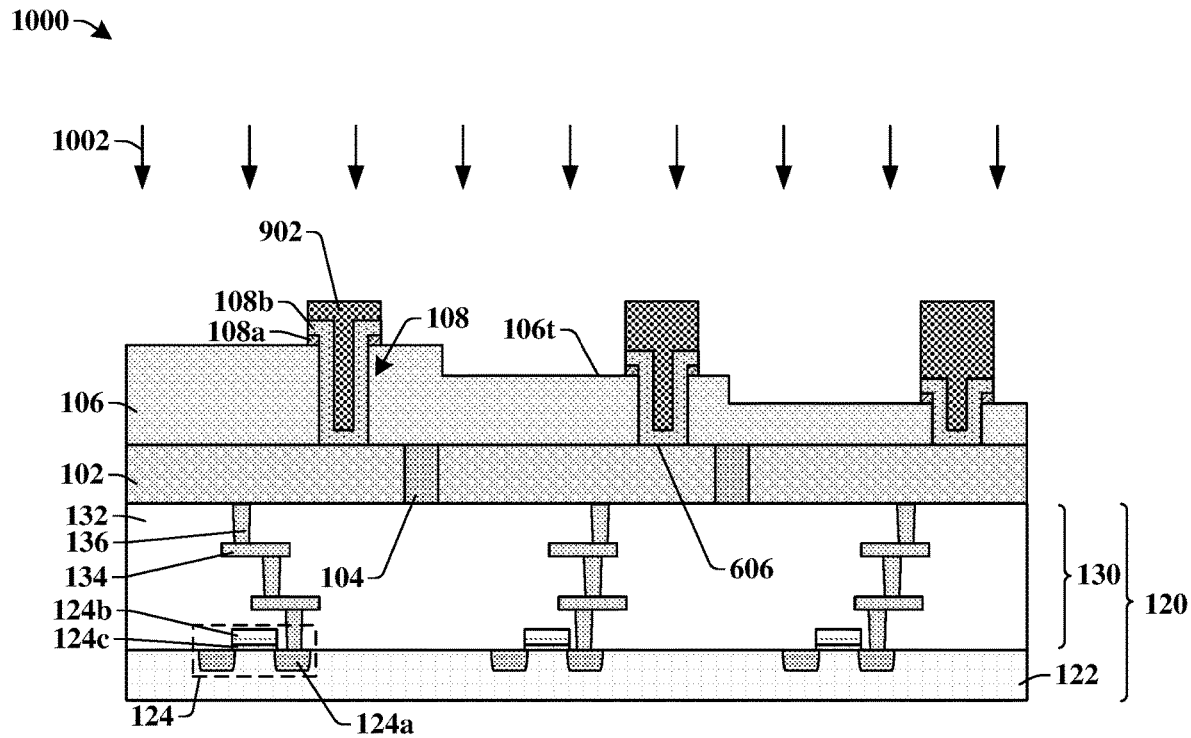

As shown in the cross-sectional view 1000 of FIG. 10, a second etching process 1002 may be performed to remove peripheral portions of the conformal protective layer (402 of FIG. 9) and the conformal conductive layer (802 of FIG. 9) according to the second masking layer 902 to form via structures 108. The via structures 108 may comprise a protective layer 108a and a conductive layer 108b. In some embodiments, the second etching process 1002 comprises a wet etching process instead of a dry etching process to mitigate residual damage to the top surfaces 106t of the isolation structure 106 upon removal of the conformal protective layer (402 of FIG. 9). Thus, the second etching process 1002 may use a wet etchant that does not affect the isolation structure 106. Further, in some embodiments, after the second etching process 1002, the top surfaces 106t of the isolation structure 106 that are uncovered by the protective layer 108a may have a third average surface roughness that is about equal to the second surface roughness.

Figure 11:
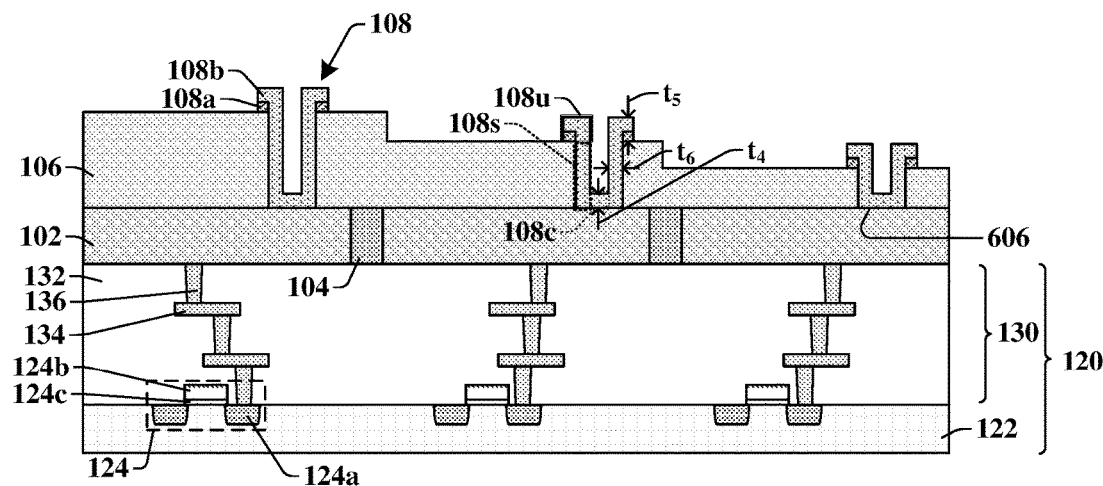

As shown in the cross-sectional view 1100 of FIG. 11, the second masking layer (902 of FIG. 10) is removed. The via structures 108 each comprise an upper horizontal segment 108u comprising the protective layer 108a and the conductive layer 108b, whereas the via structures 108 may comprise a sidewall vertical segment 108s and a center horizontal segment 108c that comprise only the conductive layer 108b. In some embodiments, the upper horizontal segment 108u of the via structures 108 has a fifth thickness $t_5$ that is greater than the fourth thickness $t_4$ of the center horizontal segment 108c and a sixth thickness $t_6$ of the sidewall vertical segment 108s. In some embodiments, the difference between the fifth thickness $t_5$ and the fourth thickness $t_4$ is about equal to the seventh thickness ($t_7$ of FIG. 4) of the conductive layer 108b. In some embodiments, the fifth thickness $t_5$ is in a range of between approximately 300 angstroms and approximately 1000 angstroms, for example.

Figure 12:
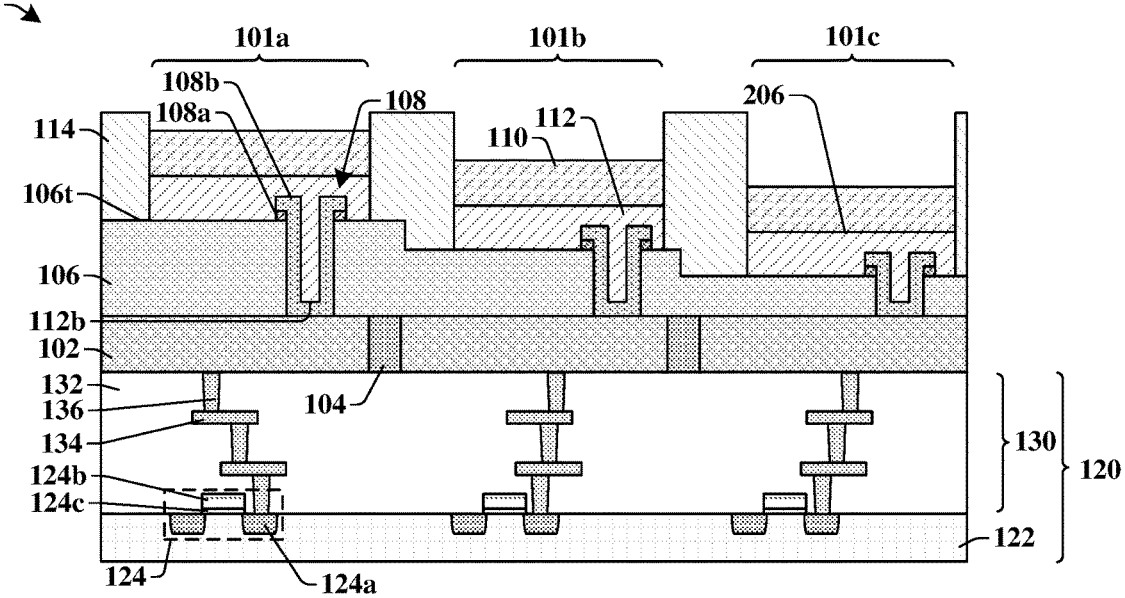

As shown in the cross-sectional view 1200 of FIG. 12, a transparent electrode 112, optical emitter structure 110, and second barrier structures 114 are formed over the isolation structure 106 and via structures 108. In some embodiments, the transparent electrode 112 has bottommost surfaces 112b that are below the top surfaces 106t of the isolation structure 106 because the transparent electrode 112 fills the third openings (804 of FIG. 8) of the via structures 108. Thus, from the cross-sectional view 1200, the via structures 108 each have two sidewall vertical segments (108s of FIG. 11) separated from one another by the transparent electrode 112. Further, the via structures 108 electrically couple the transparent electrode 112 to the reflector electrode 102. In some embodiments, the transparent electrode 112 may comprise an electrically conductive material that is also optically transparent, such as, for example, indium tin oxide (ITO), fluorine tin oxide (FTO), or the like. In some embodiments, the transparent electrode 112 may have a thickness that is, for example, in a range of between approximately 500 angstroms and approximately 3000 angstroms. In some embodiments, the optical emitter structure 110 may be or comprise an organic light emitting diode (OLED) or some other suitable light generating device. In some embodiments, the optical emitter structure 110 may have a thickness in the range of between, for example, approximately 500 angstroms and approximately 3000 angstroms.

In some embodiments, in order to generate light at a first interface 206 between the transparent electrode 112 and the optical emitter structure 110 during operation of the display device, the transparent electrode 112 and the optical emitter structure 110 may comprise different materials. Further, in some embodiments, the second barrier structures 114 may separate portions of the transparent electrode 112 and the optical emitter structure 110 to define a first pixel region 101a, a second pixel region 101b, and a third pixel region 101c. It will be appreciated that the display device may comprise an array of pixel regions, and may comprise more than the first, second, and third pixel regions 101a, 101b, 101c. Some of the second barrier structures 114 may directly overlie the first barrier structures 104, and the second barrier structures 114 may comprise a dielectric material to electrically and optically isolate the pixel regions (101a, 101b, 101c) from one another. For example, the second barrier structures 114 may comprise a nitride (e.g., silicon nitride, silicon oxynitride), an oxide (e.g., silicon oxide), or the like. For example, in some embodiments, the second barrier structures 114 may comprise a multi-layer film stack of silicon nitride and silicon oxide. Further, in some embodiments, the second barrier structures 114 may comprise a same material as the isolation structure 106, the first barrier structures 104, and/or the interconnect dielectric structure 132. The transparent electrode 112, the optical emitter structure 110 and the second barrier structures 114 may each be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

Thus, the display device comprises control circuitry 120 to selectively operate the first, second, and third pixel regions 101a, 101b, 101c. Because the protective layer 108a that protected the isolation structure 106 from damage by the cleaning process (702 of FIG. 7), each of the pixel regions (101a, 101b, 101c) may be selectively operated by the control circuitry 120 to reliably emit colored light depending on the thicknesses ($t_1$, $t_2$, $t_3$) of the isolation structure 106.

Figure 13:
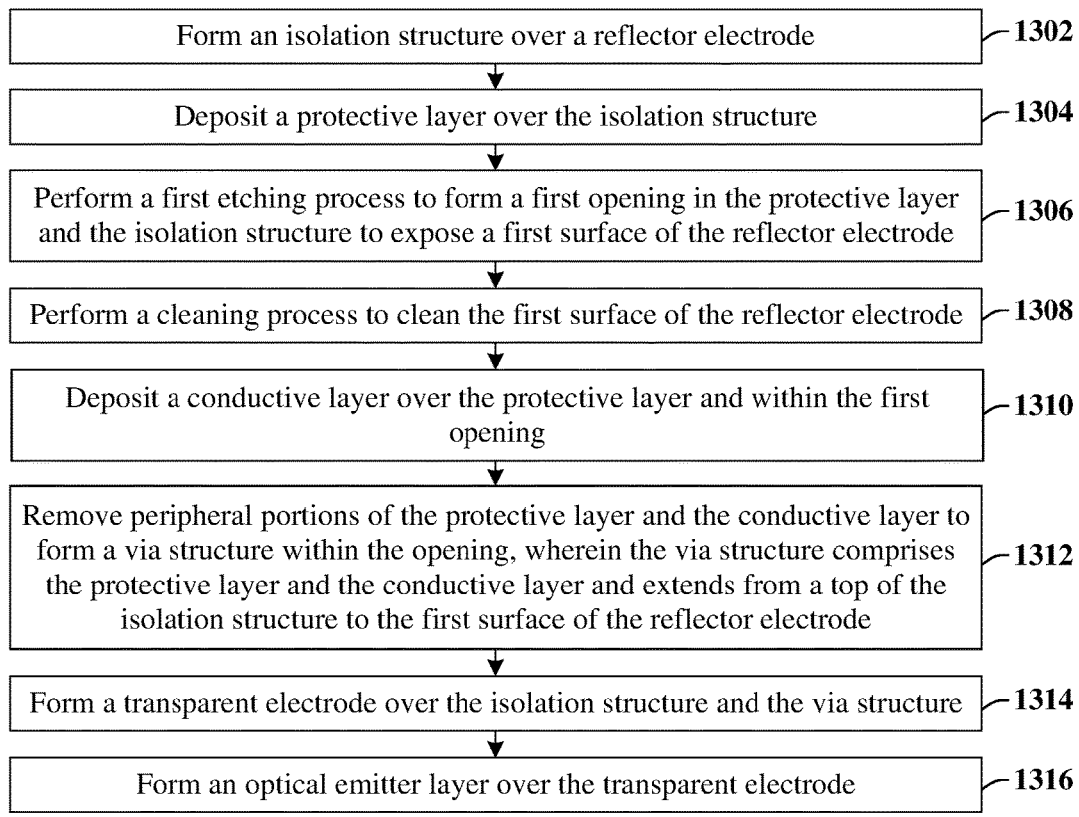
FIG. 13 illustrates a flow diagram of some embodiments of a method corresponding to FIGS. 3-12.

FIG. 13 illustrates a flow diagram of some embodiments of a method 1300 corresponding to FIGS. 3-12.

While method 1300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1302, an isolation structure is formed over a reflector electrode. FIG. 3 illustrates cross-sectional view 300 of some embodiments corresponding to act 1302.

At act 1304, a protective layer is deposited over the isolation structure. FIG. 4 illustrates cross-sectional view 400 of some embodiments corresponding to act 1304.

At act 1306, a first etching process is performed to form a first opening in the protective layer and the isolation structure to expose a first surface of the reflector electrode. FIGS. 5 and 6 illustrate cross-sectional views 500 and 600 of some embodiments corresponding to act 1306.

At act 1308, a cleaning process is performed to clean the first surface of the reflector electrode. FIG. 7 illustrates cross-sectional view 700 of some embodiments corresponding to act 1308.

At act 1310, a conductive layer is deposited over the protective layer and within the first opening. FIG. 8 illustrates cross-sectional view 800 of some embodiments corresponding to act 1310.

At act 1312, peripheral portions of the protective layer and the conductive layer are removed to form a via structure within the opening, wherein the via structure comprises the protective layer and the conductive layer and extends from a top of the isolation structure to the first surface of the reflector electrode. FIGS. 9-11 illustrate cross-sectional views 900-1100 of some embodiments corresponding to act 1312.

At act 1314, a transparent electrode is formed over the isolation structure and the via structure.

At act 1316, an optical emitter structure is formed over the transparent electrode. FIG. 12 illustrates cross-sectional view 1200 of some embodiments corresponding to acts 1314 and 1316.

Therefore, the present disclosure relates to a method of manufacturing a via structure using a protective layer and a conductive layer over an isolation structure to mitigate damage to the isolation structure, thereby producing a reliable display device.

Accordingly, in some embodiments, the present disclosure relates to display device comprising: an isolation structure disposed over a reflector electrode; a transparent electrode disposed over the isolation structure; an optical emitter structure disposed over the transparent electrode; and a via structure extending from the transparent electrode at a top surface of the isolation structure to a top surface of the reflector electrode, wherein the via structure comprises a center horizontal segment contacting the top surface of the reflector electrode, a sidewall vertical segment contacting an inner sidewall of the isolation structure, and an upper horizontal segment contacting the top surface of the isolation structure, wherein the upper horizontal segment is connected to the center horizontal segment by the sidewall vertical segment, and wherein the upper horizontal segment is thicker than the center horizontal segment.

In other embodiments, the present disclosure relates to a display device comprising: a reflector electrode coupled to an interconnect structure; an isolation structure disposed over the reflector electrode; a transparent electrode disposed over the isolation structure; an optical emitter structure disposed over the transparent electrode; and a via structure extending from a top surface of the isolation structure to the reflector electrode, wherein the via structure comprises a first layer on the top surface of the isolation structure and further comprises a second layer, wherein the second layer overhangs the top surface of the isolation structure and is spaced from the top surface of the isolation structure by the first layer, and wherein the second layer has a downward protrusion directly contacting the reflector electrode and an inner sidewall of the isolation structure.

In yet other embodiments, the present disclosure relates to a method of forming a display device, the method comprising: forming an isolation structure over a reflector electrode; depositing a protective layer over the isolation structure; forming a first opening extending through the protective layer and the isolation structure to expose a first surface of the reflector electrode, wherein inner sidewalls of the protective layer and the isolation structure define sidewalls of the first opening; performing a cleaning process to clean the first surface of the reflector electrode; depositing a conductive layer over the protective layer, the sidewalls of the first opening, and the first surface of the reflector electrode; and performing an etching process to remove peripheral portions of the protective layer and the conductive layer to form a via structure comprising the protective layer and the conductive layer, wherein the via structure directly contacts and extends from a top surface of the isolation structure to the first surface of the reflector electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an isolation structure over a reflector electrode;
forming a protective layer over the isolation structure;
performing a first removal process to form a first opening in the protective layer and the isolation structure to expose a first surface of the reflector electrode;
performing a cleaning process to clean the first surface of the reflector electrode;
forming a conductive layer over the protective layer and within the first opening, wherein the conductive layer comprises a different material than the protective layer; and
performing a second removal process to remove peripheral portions of the protective layer and the conductive layer to form a via structure within the first opening, extending through the isolation structure to contact the reflector electrode, and comprising the protective layer and the conductive layer.

2. The method of claim 1, wherein the first removal process comprises a dry etching process, and wherein the cleaning process comprises a sputtering process.

3. The method of claim 1, wherein the second removal process comprises:
forming a masking structure arranged over the opening of the isolation structure;
performing a wet etching process to remove the peripheral portions of the conductive layer and of the protective layer; and
removing the masking structure.

4. The method of claim 1, wherein the first opening has a first width measured between inner sidewalls of the isolation structure, wherein the conductive layer has a first thickness, and wherein the first thickness is less than half of the first width.

5. The method of claim 1, further comprising:
forming a transparent electrode over the isolation structure and the via structure; and
forming an optical emitter structure over the transparent electrode.

6. The method of claim 1, wherein before forming the protective layer, the isolation structure has a first average surface roughness, wherein after performing the second removal process, the isolation structure has a second average surface roughness about equal to the first average surface roughness.

7. A method comprising:
forming a reflector electrode over an interconnect structure;
forming an isolation structure over the reflector electrode;
forming a protective layer over the isolation structure;
performing a dry etching process to form a first opening extending through the protective layer and the isolation structure to expose an upper surface of the reflector electrode;
performing a cleaning process to clean the upper surface of the reflector electrode;
forming a conductive layer over the protective layer and within the first opening; and
performing a wet etching process to remove peripheral portions of the protective layer and of the conductive layer, wherein remaining portions of the conductive layer and the protective layer form a via structure extending from a topmost surface of the isolation structure to the upper surface of the reflector electrode.

8. The method of claim 7, wherein the protective layer is substantially resistant to removal by the cleaning process.

9. The method of claim 7, wherein the isolation structure is substantially resistant to removal by the dry etching process.

10. The method of claim 7, further comprising:
forming a masking structure over the protective layer, wherein the dry etching process is performed according to an opening in the masking structure; and
removing the masking structure before the cleaning process.

11. The method of claim 7, wherein the protective layer comprises a different material than the conductive layer.

12. The method of claim 7, further comprising:
forming a transparent electrode over the via structure and the isolation structure.

13. The method of claim 7, wherein the cleaning process comprises an additional dry etching process.

14. A method of forming a display device, the method comprising:
forming an isolation structure over a reflector electrode;
depositing a protective layer over the isolation structure;
forming a first opening extending through the protective layer and the isolation structure to expose a first surface of the reflector electrode, wherein inner sidewalls of the protective layer and the isolation structure define sidewalls of the first opening;
performing a cleaning process to clean the first surface of the reflector electrode;
depositing a conductive layer over the protective layer, the sidewalls of the first opening, and the first surface of the reflector electrode; and
performing an etching process to remove peripheral portions of the protective layer and the conductive layer to form a via structure comprising the protective layer and the conductive layer, wherein the via structure directly contacts and extends from a top surface of the isolation structure to the first surface of the reflector electrode.

15. The method of claim 14, wherein the protective layer and the conductive layer comprise a same material.

16. The method of claim 14, wherein the cleaning process is an argon sputter process.

17. The method of claim 14, wherein performing of the etching process comprises a wet etching process, and wherein forming the first opening comprises a dry etching process.

18. The method of claim 14, wherein before forming the protective layer, the isolation structure has a first average surface roughness, wherein after performing the etching process, the isolation structure has a second average surface roughness about equal to the first average surface roughness.

19. The method of claim 14, further comprising:
forming a transparent electrode over the isolation structure and the via structure; and
forming an optical emitter structure over the transparent electrode, wherein the transparent electrode and the optical emitter structure comprise different materials.

20. The method of claim 14, wherein the protective layer is thinner than the conductive layer.

* * * * *